United States Patent
Cho et al.

(10) Patent No.: US 8,148,267 B2
(45) Date of Patent: Apr. 3, 2012

(54) METHOD OF FORMING ISOLATION LAYER OF SEMICONDUCTOR MEMORY DEVICE

(75) Inventors: Whee Won Cho, Cheongju-si (KR); Jong Hye Cho, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 900 days.

(21) Appl. No.: 12/137,380

(22) Filed: Jun. 11, 2008

(65) Prior Publication Data

US 2009/0170321 A1 Jul. 2, 2009

(30) Foreign Application Priority Data

Dec. 28, 2007 (KR) .................. 10-2007-0140285

(51) Int. Cl.
*H01L 21/302* (2006.01)
*H01L 21/461* (2006.01)
*H01L 21/311* (2006.01)

(52) U.S. Cl. .................. 438/704; 438/692; 216/57
(58) Field of Classification Search .................. 438/704
See application file for complete search history.

(56) References Cited

U.S. PATENT DOCUMENTS

| | | | | |
|---|---|---|---|---|
| 6,372,657 B1 * | 4/2002 | Hineman et al. | .............. | 438/723 |
| 7,081,414 B2 | 7/2006 | Zhang et al. | .................. | 438/710 |
| 7,256,134 B2 | 8/2007 | Kim et al. | ...................... | 438/723 |
| 2004/0214405 A1 * | 10/2004 | Ahn et al. | ..................... | 438/443 |
| 2005/0285179 A1 * | 12/2005 | Violette | ........................ | 257/315 |
| 2007/0111462 A1 * | 5/2007 | Lee et al. | ....................... | 438/386 |

FOREIGN PATENT DOCUMENTS

| KR | 10-2005-0003011 | | 1/2005 |
|---|---|---|---|
| KR | 10-2005-0108151 | | 11/2005 |
| KR | 1020060058575 | * | 2/2006 |
| KR | 10-2006-0058575 | | 5/2006 |
| KR | 10-2006-0105857 A | | 10/2006 |
| KR | 10-2007-0087373 | | 8/2007 |

* cited by examiner

*Primary Examiner* — Nadine G Norton
*Assistant Examiner* — Stephanie Duclair
(74) *Attorney, Agent, or Firm* — Marshall, Gerstein & Borun LLP

(57) ABSTRACT

A method of forming isolation layers of a semiconductor memory device. In accordance with an embodiment of the invention, a semiconductor substrate in which trenches are formed is provided. A first dielectric layer is formed over the semiconductor substrate including the trenches. An opening width of the trench is widened by performing a first etch process to remove a part of the first dielectric layer, followed by an annealing process. Fluorine-containing impurities formed in the first dielectric layer as a result of the etching and annealing processes are removed by performing a second etch process. A second dielectric layer is formed over the semiconductor substrate including the first dielectric layer.

13 Claims, 4 Drawing Sheets

METHOD OF FORMING ISOLATION LAYER OF SEMICONDUCTOR MEMORY DEVICE

CROSS-REFERENCE TO RELATED APPLICATION

Priority to Korean patent application number 10-2007-0140285, filed on Dec. 28, 2007, the entire disclosure of which is incorporated by reference, is claimed.

BACKGROUND OF THE INVENTION

The invention relates to a method of forming isolation layers of a semiconductor memory device and, more particularly, to a method of forming isolation layers of a semiconductor memory device with improved electrical characteristics by reducing the content of impurities that may be generated when the isolation layers are formed.

A semiconductor memory device includes a number of memory cells for storing data and a number of transistors for transferring driving voltages. A flash memory device includes a number of strings in each of which memory cells are connected in series. An isolation layer is formed between the respective strings in order to insulate the strings electrically.

Meanwhile, as the degree of integration of semiconductor memory devices increases, the widths of the strings have been narrowed and, therefore, the width of the isolation layer has also been narrowed. As the width of the isolation layer is narrowed, processes of forming the isolation layer have become more difficult to carry out, as described below in detail by taking a flash memory device as an example.

In a process for forming an isolation later in a semiconductor memory device, a tunnel dielectric layer and a conductive layer for a floating gate are formed over a semiconductor substrate. Trenches are formed by sequentially patterning the conductive layer and the tunnel dielectric layer of an isolation region. In particular, as the degree of integration of a semiconductor device increases, the depth of the trench becomes greater than the width of the trench, thereby increasing the aspect ratio of the trench. If the aspect ratio of the trench is increased, voids can be generated within the trench because the bottom of the trench is not all gap-filled until the top of the trench is covered in the gap-fill process of the trench. Further, if material or a formation method with excellent step coverage is employed, materials formed on the sidewalls of the trenches face each other, resulting in formation of a seam.

An etchant can penetrate into the void or seam in a subsequent etch process, generating etch damage. The void or seam also causes degradation of the electrical characteristics of the semiconductor memory device.

To solve the problems, an isolation layer can be formed by gap-filling the bottom of the trench with a first dielectric layer (e.g., a fluid material such as SOD (Spin On Dielectric)) and further forming a second dielectric layer having a dense film quality on the top of the first dielectric layer. The second dielectric layer can be formed of, for example, an HDP (High Density Plasma) layer. Here, if a gap-fill process is not convenient even in the formation process of the second dielectric layer, a third dielectric layer (for example, an HDP layer) may be further formed after widening the top width of the trench through an etch process. In this case, damage can be generated due to the etch process. This is described in detail with reference to FIG. 1.

FIG. 1 is a photograph illustrating isolation layers of a conventional semiconductor memory device. Referring to FIG. 1, a tunnel dielectric layer 12, a conductive layer 14 for a floating gate 14, and an isolation mask pattern 16 are sequentially formed in an active region 10 of a semiconductor substrate. A first dielectric layer (not shown) and a second dielectric layer 18 are formed within a trench. If a wet etch process is performed using an etch process of widening the top width of the trench as described above, there may be a difference in the wet etch rate between regions A in which the film quality of the second dielectric layers 18 is formed irregularly. Alternatively, if a dry etch process is performed instead of the wet etch process, fluorine (F) included in the second dielectric layer 18 is combined with the tunnel dielectric layer 12, which may lower a subsequent program threshold voltage.

BRIEF SUMMARY OF THE INVENTION

The invention is directed to a method of forming isolation layers of a semiconductor memory device, which can reduce the amount of fluorine (F)-containing impurities that formed in a second dielectric layer while widening the top width of a trench by etching and annealing, by gap-filling the bottom of the trench with a fluid first dielectric layer, forming the second dielectric layer, and then performing a dry etch process and a wet etch process.

In accordance with an aspect of the invention, a method of forming isolation layers of a semiconductor memory device is provided. According to the method, a semiconductor substrate in which trenches having opening widths are formed is provided. A first dielectric layer is formed over the semiconductor substrate including the trenches. An opening width of the trench is widened by performing a first etch process to remove a part of the first dielectric layer. An annealing process is performed after carrying out the first etch process. Fluorine-containing impurities formed in the first dielectric layer as a result of the first etch process and the annealing process are removed by performing a second etch process. A second dielectric layer is formed over the semiconductor substrate including the first dielectric layer. The first dielectric layer and the second dielectric layer are preferably formed of a suitable oxide having a suitable shape, and is preferably an HDP (High Density Plasma) layer or an $O_3$-TEOS layer.

In accordance with another aspect of the invention, a method of forming isolation layers of a semiconductor memory device is provided. According to the method, a semiconductor substrate in which trenches having bottoms and opening widths are formed is provided. Bottoms of the trenches are gap-filled with a first dielectric layer. A second dielectric layer is formed over the semiconductor substrate including the first dielectric layer. An opening width of the trench is widened by performing a first etch process to remove a part of the second dielectric layer. An annealing process is performed after carrying out the first etch process. Fluorine-containing impurities formed in the second dielectric layer as a result of the first etch process and the annealing process are removed by performing a second etch process. A third dielectric layer is formed over the semiconductor substrate including the second dielectric layer.

The first dielectric layer is preferably formed of an SOD (Spin On Dielectric) layer. The SOD layer preferably comprises a PSZ (polysilazane) layer. The second dielectric layer and the third dielectric layer preferably comprise an suitable oxide, highly preferably an HDP (High Density Plasma) layer or an $O_3$-TEOS layer.

The first etch process is preferably performed using a dry etch process employing a mixed gas of $NH_3$ and HF. Alternatively, the dry etch process may employ a mixed gas of $NH_3$ and $NF_3$, for example.

The annealing process is preferably performed at a temperature in the range of 100 degrees Celsius to 300 degrees Celsius.

The second etch process is preferably performed using a wet etch process. The wet etch process preferably employs an etchant comprising HF.

A polishing process is preferably further performed after forming the third dielectric layer.

DESCRIPTION OF SPECIFIC EMBODIMENTS

Now, a specific embodiment according to the invention will be described with reference to the accompanying drawings. However, the invention is not limited to the disclosed embodiment, but may be implemented in various manners. The embodiment is provided to complete the disclosure of the invention and to allow those having ordinary skill in the art to understand the scope of the invention. The scope of the invention is defined by the claims.

FIGS. 2a to 2g are sectional views illustrating a method of forming isolation layers of a semiconductor memory device in accordance with an embodiment of the invention.

A flash memory device is described below as a non-limiting example.

Figure 1:
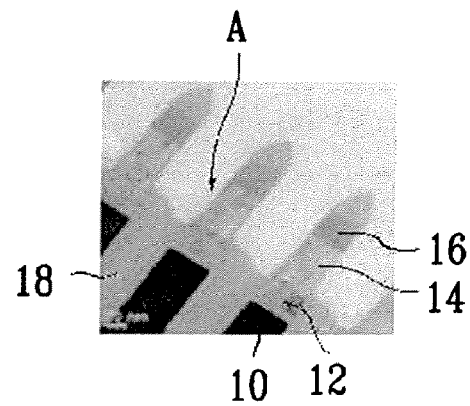
FIG. 1 is a photograph illustrating isolation layers of a conventional semiconductor memory device.
Figure 2A:
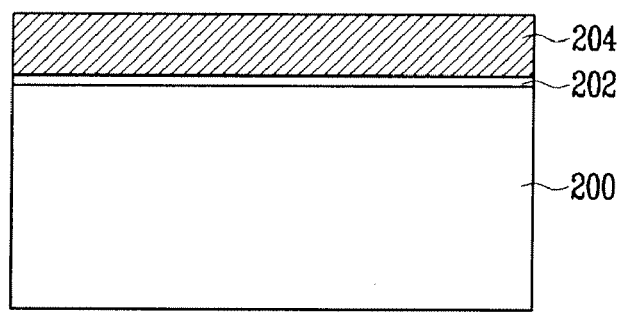
FIGS. 2a to 2g are sectional views illustrating a method of forming isolation layers of a semiconductor memory device in accordance with an embodiment of the invention.

Referring to FIG. 2a, a tunnel dielectric layer 202 and a conductive layer 204 for a floating gate are sequentially laminated over a semiconductor substrate 200. The tunnel dielectric layer 202 preferably comprises an oxide film and the conductive layer 204 preferably comprises a polysilicon film. For example, the conductive layer 204 can be formed of an undoped polysilicon film or a doped polysilicon film.

Figure 2B:
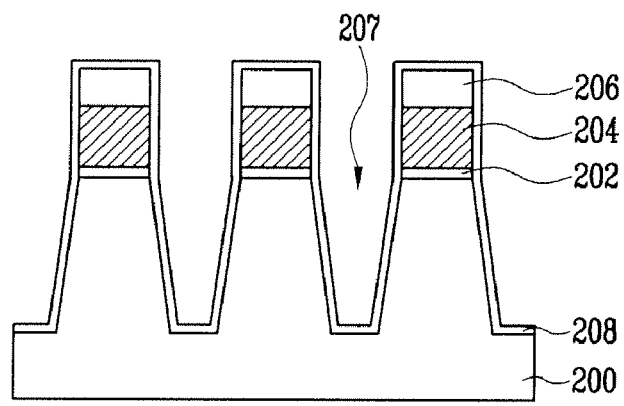

Referring to FIG. 2b, an isolation mask pattern 206 whose isolation regions are opened is formed on the conductive layer 204. The conductive layer 204, the tunnel dielectric layer 202, and the semiconductor substrate 200 are sequentially patterned by performing an etch process along the isolation mask pattern 206. Trenches 207 are formed by removing a part of the exposed semiconductor substrate 200. A liner dielectric layer 208 is formed on a surface of the semiconductor substrate 200 including the trenches 207. Here, before the liner dielectric layer 208 is formed, a wall oxide film (not shown) may be further formed along the surface of the trenches 207 in order to compensate for surface damage to the semiconductor substrate 200 in the formation process of the trenches 207.

Figure 2C:
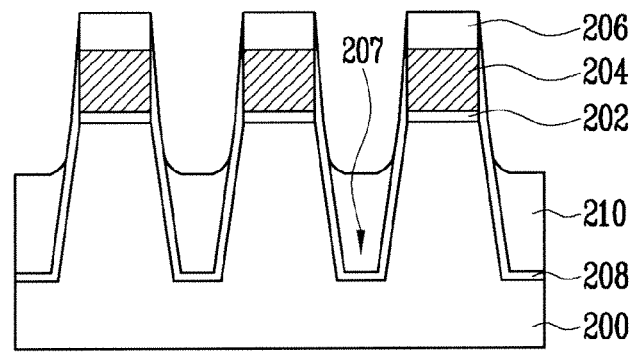

Referring to FIG. 2c, the bottoms of the trenches 207 are gap-filled with a first dielectric layer 210. Specifically, the first dielectric layer 210 is formed over the semiconductor substrate 200 on which the liner dielectric layer 208 is formed so that the bottoms of the trenches 207 are gap-filled. The first dielectric layer 210 comprises an SOD material. The SOD layer is fluid material, and it is easy to gap-fill the bottoms of the trenches 207 having an increased aspect ratio when the degree of integration of a semiconductor device is high. The SOD layer preferably comprises PSZ (polysilazane), which has a relatively low wet etch rate and sufficient hardness to allow a subsequent Chemical Mechanical Polishing (CMP) or other polishing process. After the PSZ layer is formed, a densification process is performed in order to densify the film quality of the PSZ layer. The densification process is preferably performed using an annealing process. After a polishing process is performed in order to expose the isolation mask pattern 206, the height of the first dielectric layer 210 is lowered. Here, the height of the first dielectric layer 210 can be lower than that of the tunnel dielectric layer 202.

Polishing is desirable because the oxide height in the entire wafer should be kept uniform. The oxide height affects the Effective Field Height (EFH) of the device, and if the height is variable the device will not operate properly.

Figure 2D:
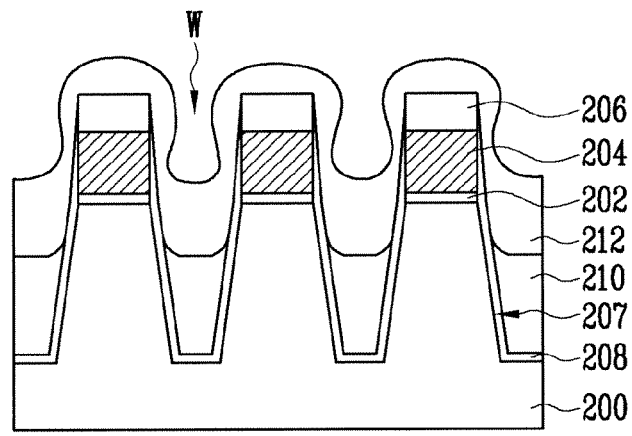

Referring to FIG. 2d, a second dielectric layer 212 is formed over the semiconductor substrate 200 including the first dielectric layer 210. The second dielectric layer 212 is preferably formed of material more dense than the first dielectric layer 210 in order to prevent an etchant from penetrating into the first dielectric layer 210 in a subsequent etch process. The second dielectric layer 212 is formed of any suitable oxide, but is preferably formed of an HDP layer or an $O_3$-TEOS layer.

Here, although the trenches 207 can be fully gap-filled with the second dielectric layer 212, if the aspect ratio of the trenches 207 is increased due to an increased degree of integration of a semiconductor device, voids may be generated within the trenches 207. Specifically, a top width W of the trench 207 can become narrower than a bottom width of the trench before the inside of the trench 207 is fully gap-filled. Furthermore, if the top of the trench 207 is fully covered with the second dielectric layer 212, voids may be generated in regions of the trenches 207 that are not fully gap-filled. Thus, the opening width W of the trench 207 can be widened by performing an etch process, preferably a dry etch process, on the second dielectric layer 212. This is described below in detail with reference to the following drawing.

Figure 2E:
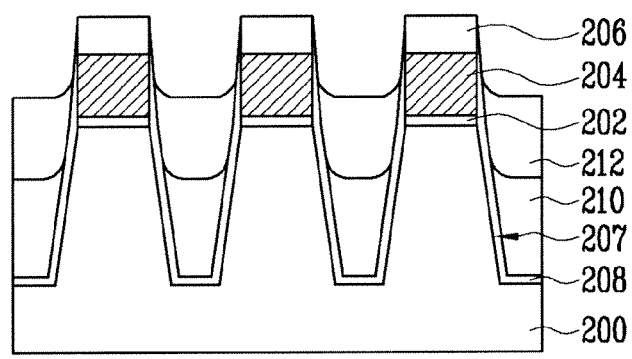

Referring to FIG. 2e, the second dielectric layer 212 is partially removed by performing an etch process. Specifically, the top width of the trench 207 is widened by reducing the thickness of the second dielectric layer 212. The etch process preferably comprises sequentially performing a first etch process and a second etch process. The first etch process may be performed using a wet etch process or a dry etch process. However, if the wet etch process is carried out, it may be difficult to make the height of the second dielectric layer 212 uniform when the degree of integration of the semiconductor device is high. In other words, since it is difficult to control the thickness of the second dielectric layer 212 through the wet etch process, the conductive layer 204 for the floating gate can be damaged while being exposed when the conductive layer 204 is over etched. Thus, the first etch process is preferably performed using a dry etch process, although anisotropic etching methods generally will suffice, as long as the upper part of the oxide is removed much more rapidly than the lower part of the oxide. More specifically, the first etch process is preferably performed using NHx and HFy gases. For example, a $NH_3$ gas and a HF gas can be used. This is described below in detail with reference to the following chemical reaction.

[Chemical reaction]

The chemical reaction ① is a chemical reaction of a gas injected at the time of a dry etch process. When the $NH_3$ gas and the HF gas are mixed, $NH_4^+$ and $F^-$ are formed. In the chemical reaction ②, when $NH_4^+$ and $F^-$ come in contact with the second dielectric layer 212 including $SiO_2$, $(NH_4)_2SiF_6$ of a solid state is formed. The chemical reaction ③ is a reaction in which after the first etch process is performed, $SiF_4$, $NH_3$ and HF, which are byproducts, are removed by performing an annealing process on $(NH_4)_2SiF_6$ of a solid state. Here, the annealing process is preferably performed at a temperature in the range of 100 degrees Celsius to 300 degrees Celsius, highly preferably and illustratively 160 degrees Celsius to 180 degrees Celsius for at least 50 seconds, highly preferably 120 seconds. In carrying out the first etch process, a mixed gas of $NH_3$ and $NF_3$ may be injected into a chamber using a plasma remote method instead of the mixed gas of $NH_3$ and HF. The first etch process is preferably and illustratively carried out at a pressure of 80 Torr, at room temperature with a flow rate of $NF_3$ or HF of 20 sccm, with Ar carrier gas.

Meanwhile, when the first etch process and the subsequent annealing step are performed, fluorine (F) or other impurities may remain near the surface of the second dielectric layer 212. Specifically, this is described with reference to the graph of FIG. 3.

Figure 3:
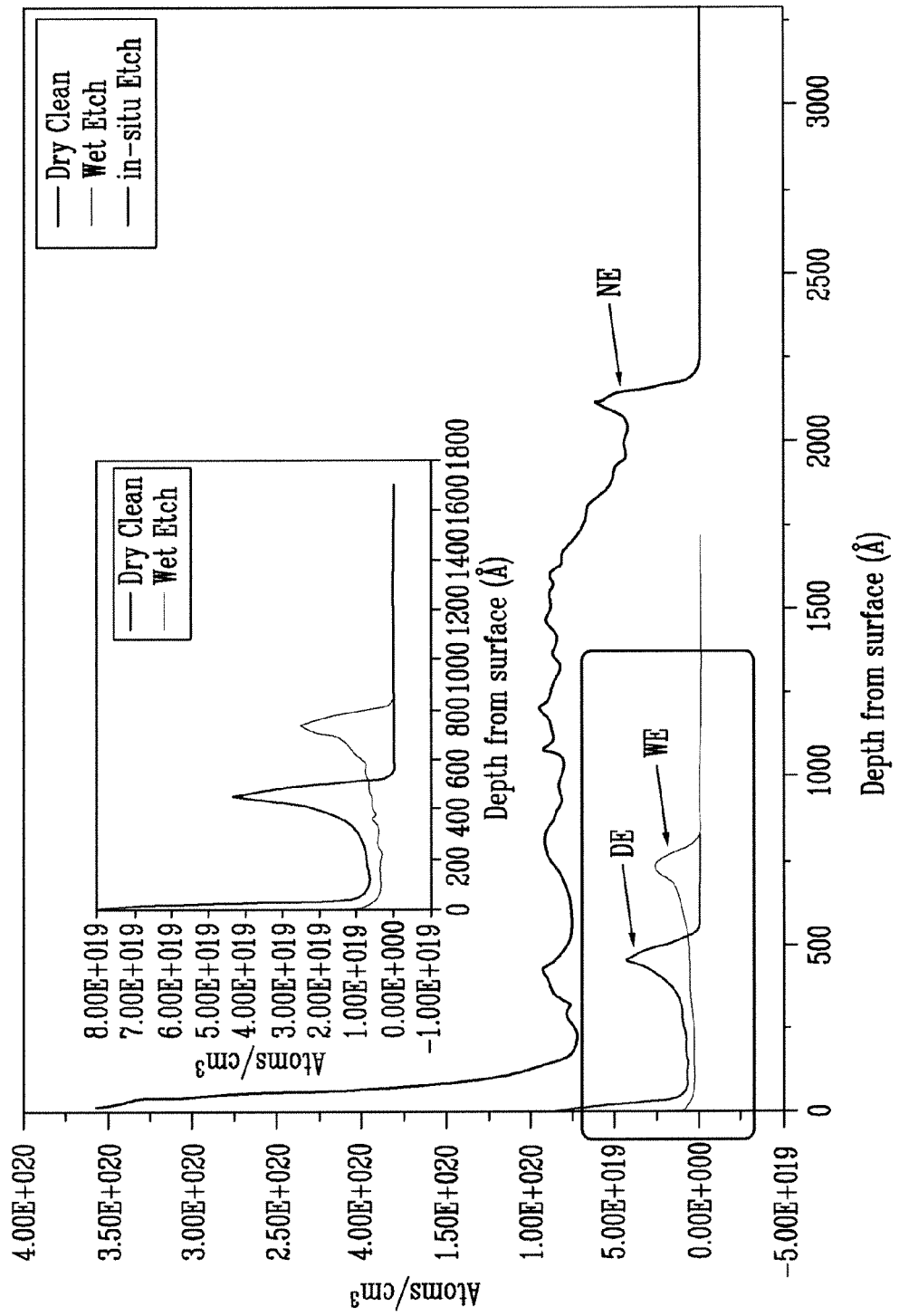
FIG. 3 is a graph showing distributions of fluorine (F) depending on an etch process.

FIG. 3 is a graph showing distributions of fluorine (F) depending on an etch process.

From FIG. 3, it can be seen that distributions of fluorine (F) differ depending on the dry etch process DE and the wet etch process WE. As described above with reference to FIG. 2e, if the dry etch process DE is performed as the first etch process, the amount of fluorine (F) can be reduced while making uniform the thickness of the second dielectric layer 212. However, it can be seen that a great amount of fluorine (F) still remains near the surface of the second dielectric layer 212.

Further, from a graph showing a dry etch process NE employing only the $NF_3$ gas of the dry etch process, it can be seen that fluorine (F) is distributed over a very deep depth, for example, up to a depth of 2300 angstrom from the surface. If fluorine (F) remains within the second dielectric layer 212, it may lower the threshold voltage in a subsequent program operation. It is preferred that fluorine (F) be removed.

Accordingly, the first etch process is preferably performed using the dry etch process DE employing a mixed gas of $NH_3$ and HF (or the mixed gas of $NH_3$ and $NF_3$). A second etch process is then performed following an annealing step in order to reduce the amount of fluorine (F) while removing the surface of the second dielectric layer 212. The second etch process is described below in detail.

The second etch process is preferably performed using a wet etch process in order to remove fluorine (F) distributed near the surface of the second dielectric layer 212 as a result of the first etch process and the annealing process as described above. For example, the second etch process is preferably performed using an etchant including HF. Buffered Oxide Etchant (BOE) is another suitable etchant for use in the second etch process.

Consequently, the thickness of the second dielectric layer 212 can be made uniform and the content of fluorine (F) included in the second dielectric layer 212 can be reduced. In addition, since the exposure of the conductive layer 204 for the floating gate can be prohibited, damage to the conductive layer 204 can be prevented.

Figure 2F:
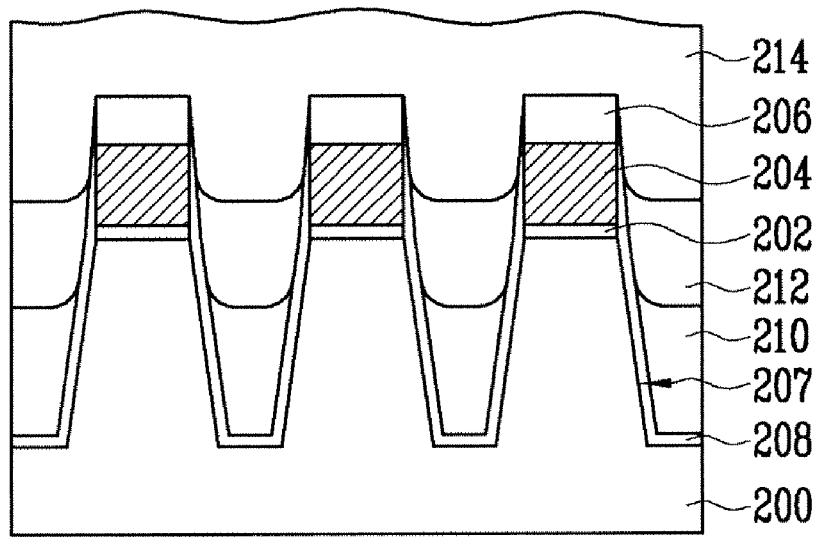

Referring to FIG. 2f, a third dielectric layer 214 for isolation layers is formed over the semiconductor substrate 200 including the second dielectric layer 212. Here, since the top width of the trenches 207 has been widened through the first and second etch processes as described above, the formation process of the third dielectric layer 214 can be performed easily. The third dielectric layer 214 is preferably formed of an HDP layer or an $O_3$-TEOS layer.

Figure 2G:
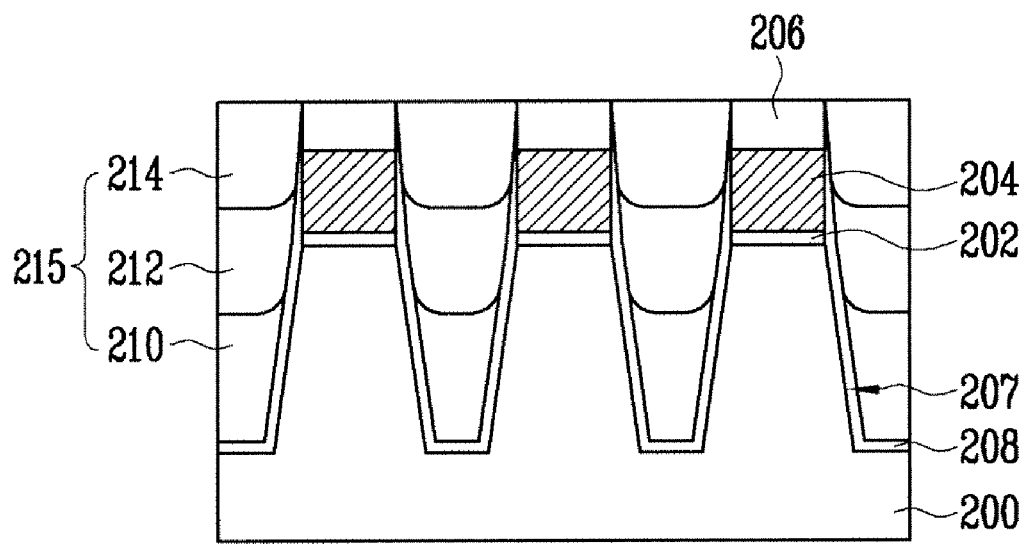

Referring to FIG. 2g, isolation layers 215 in each of which the first to third dielectric layers 210, 212, and 214 are laminated can be formed by performing a polishing process, preferably Chemical Mechanical Polishing (CMP) so that the isolation mask pattern 206 is exposed.

As described above, according to the invention, the bottom of the trench is gap-filled with the first dielectric layer, the second dielectric layer is formed, and, preferably, the dry etch process and the wet etch process are then performed. Thus, the amount of fluorine (F)-containing impurities contained in the second dielectric layer can be reduced while widening the top width of the trench. Accordingly, electrical degradation of the tunnel dielectric layer can be prohibited and degradation of the electrical characteristics of a flash memory device can be prevented.

The embodiment disclosed herein has been proposed to allow a person skilled in the art to easily implement the invention, and the person skilled in the part may implement the invention by a combination of embodiments. Therefore, the scope of the invention is not limited by or to the embodiment as described above, and should be construed to be defined only by the appended claims and their equivalents.

What is claimed is:

1. A method of forming isolation layers of a semiconductor memory device, the method comprising:
    forming a tunnel dielectric layer and a conductive layer for a floating gate on a semiconductor substrate;
    forming trenches in the semiconductor substrate by removing portions of the conductive layer, the tunnel dielectric layer and the semiconductor substrate;
    forming a first dielectric layer along a resulting surface after forming the trenches;
    performing a dry etch process to widen a width between the first dielectric layer formed on sidewalls of the conductive layer in the trenches;
    performing an annealing process to remove fluorine-containing impurities caused by the dry etch process;
    performing a wet etch process to remove remained fluorine-containing impurities after the dry etch process and the annealing process; and
    forming a second dielectric layer over the first dielectric layer to fill the trenches.

2. The method of claim 1, comprising forming the first dielectric layer and the second dielectric layer of an HDP (High Density Plasma) layer or an $O_3$-TEOS layer.

3. The method of claim 1, comprising performing the dry etch process employing a mixed gas of $NH_3$ and HF.

4. The method of claim 1, wherein the annealing process is performed at a temperature in the range of 100 degrees Celsius to 300 degrees Celsius.

5. The method of claim 1, comprising performing the wet etch process employing an etchant comprising HF.

6. The method of claim 1, further comprising performing a polishing process after forming the second dielectric layer.

7. The method of claim 6, wherein the polishing process comprises Chemical Mechanical Polishing (CMP).

8. A method of forming isolation layers of a semiconductor memory device, the method comprising:
    forming a tunnel dielectric layer and a conductive layer for a floating gate on a semiconductor substrate;
    forming trenches in the semiconductor substrate by removing portions of the conductive layer, the tunnel dielectric layer and the semiconductor substrate;
    gap-filling bottoms of the trenches with a first dielectric layer comprising a Spin On Dielectric (SOD) material;

forming a second dielectric layer along a resulting surface after forming the first dielectric layer;

performing a dry etch process to widen a width between the second dielectric layer formed on sidewalls of the conductive layer in the trenches, wherein the dry etch process is performed using a mixed gas of $NH_3$ and HF;

performing an annealing process to remove fluorine-containing impurities caused by the dry etch process;

performing an etch process to remove remained fluorine-containing impurities after the dry etch process and the annealing process, wherein the wet etch process is performed using an etchant comprising HF; and forming a third dielectric layer over the second dielectric layer to gap-fill the trenches.

9. The method of claim 8, wherein the first dielectric layer comprises a PSZ (polysilazane) layer.

10. The method of claim 8, wherein the second dielectric layer and the third dielectric layer are formed of an HDP (High Density Plasma) layer or an $O_3$-TEOS layer.

11. The method of claim 8, wherein the annealing process is performed at a temperature in the range of 100 degrees Celsius to 300 degrees Celsius.

12. The method of claim 8, further comprising performing a polishing process after forming the third dielectric layer.

13. The method of claim 12, wherein the polishing process comprises Chemical Mechanical Polishing (CMP).

* * * * *